United States Patent
Kalandar et al.

(10) Patent No.: US 8,466,550 B2
(45) Date of Patent: Jun. 18, 2013

(54) SEMICONDUCTOR STRUCTURE AND A METHOD OF MANUFACTURING A SEMICONDUCTOR STRUCTURE

(75) Inventors: Navas Khan Oratti Kalandar, Singapore (SG); Vaidyanathan Kripesh, Singapore (SG); Xiaowu Zhang, Singapore (SG); Chee Houe Khong, Singapore (SG)

(73) Assignee: Agency for Science, Technology and Research, Connexis (SG)

( * ) Notice: Subject to any disclaimer, the term of this patent is extended or adjusted under 35 U.S.C. 154(b) by 67 days.

(21) Appl. No.: 12/994,431

(22) PCT Filed: May 28, 2008
(Under 37 CFR 1.47)

(86) PCT No.: PCT/SG2008/000194
§ 371 (c)(1),
(2), (4) Date: Jun. 6, 2011

(87) PCT Pub. No.: WO2009/145727
PCT Pub. Date: Dec. 3, 2009

(65) Prior Publication Data
US 2012/0119390 A1    May 17, 2012

(51) Int. Cl.
*H01L 23/34* (2006.01)
(52) U.S. Cl.
USPC .......... 257/723; 257/E21.499; 257/724; 257/782; 438/107; 438/109; 438/110
(58) Field of Classification Search
CPC .................. H01L 23/48; H01L 21/50
USPC .............. 257/E21.499, E23.01, 679, 680, 257/698, 723, 724, 737, 778, 782; 438/107, 438/109, 110, 114, 455, 456, 458, 759, 977
See application file for complete search history.

(56) References Cited

U.S. PATENT DOCUMENTS

| | | | | |
|---|---|---|---|---|
| 5,324,687 A | * | 6/1994 | Wojnarowski | 438/107 |
| 5,841,193 A | * | 11/1998 | Eichelberger | 257/723 |
| 5,936,305 A | * | 8/1999 | Akram | 257/723 |
| 6,706,624 B1 | * | 3/2004 | Kapusta et al. | 438/622 |
| 6,734,534 B1 | * | 5/2004 | Vu et al. | 257/668 |

(Continued)

FOREIGN PATENT DOCUMENTS

| | | |
|---|---|---|
| JP | 2003-332406 | 11/2003 |
| JP | 2005-317732 | 11/2005 |

(Continued)

OTHER PUBLICATIONS

Search Report and Written Opinion for International Application No. PCT/SG2008/000194, dated Jul. 16, 2008; 8 pages.

*Primary Examiner* — Chris Chu
(74) *Attorney, Agent, or Firm* — Alston & Bird LLP

(57) ABSTRACT

According to one embodiment of the present invention, a semiconductor structure is provided. The semiconductor structure includes a first support structure, a plurality of chips formed on the first support structure and a reinforcing structure formed on the first support structure, the reinforcing structure including an outer surrounding element which surrounds the plurality of chips and extends from a surface of the first support structure to a height higher than each of the plurality of chips. A method of manufacturing a semiconductor structure is also provided.

13 Claims, 11 Drawing Sheets

Molding with stiffening structure on the saw street

U.S. PATENT DOCUMENTS

| | | | |
|---|---|---|---|
| 6,746,898 B2 * | 6/2004 | Lin et al. | 438/113 |
| 6,794,222 B1 * | 9/2004 | Kraft et al. | 438/109 |
| 7,005,319 B1 * | 2/2006 | Chen et al. | 438/107 |
| 7,074,696 B1 * | 7/2006 | Frankowsky et al. | 438/464 |
| 7,208,344 B2 * | 4/2007 | Ho | 438/107 |
| 7,363,704 B2 * | 4/2008 | Kobayashi et al. | 29/832 |
| 7,888,172 B2 * | 2/2011 | Huang | 438/107 |
| 7,908,745 B2 * | 3/2011 | Sakamoto et al. | 29/832 |
| 8,064,217 B2 * | 11/2011 | Cho et al. | 361/765 |
| 8,227,904 B2 * | 7/2012 | Braunisch et al. | 257/686 |
| 2003/0122243 A1 * | 7/2003 | Lee et al. | 257/700 |
| 2004/0118500 A1 | 6/2004 | Wang | |
| 2005/0011668 A1 | 1/2005 | Hwang et al. | |
| 2005/0073029 A1 * | 4/2005 | Chua et al. | 257/620 |
| 2005/0124148 A1 * | 6/2005 | Tuominen | 438/618 |
| 2006/0151875 A1 | 7/2006 | Lin et al. | |
| 2007/0065653 A1 | 3/2007 | Meguro et al. | |
| 2007/0257345 A1 | 11/2007 | Fan et al. | |
| 2008/0029904 A1 * | 2/2008 | Yong et al. | 257/778 |
| 2009/0260866 A1 * | 10/2009 | Palm et al. | 174/260 |
| 2009/0302465 A1 * | 12/2009 | Huang | 257/737 |

FOREIGN PATENT DOCUMENTS

| | | |
|---|---|---|
| JP | 2006-125859 | 5/2006 |
| JP | 2006-332344 | 12/2006 |
| KR | 10-2004-0041332 | 5/2004 |

* cited by examiner

Figure 1A - Adhesive Tape
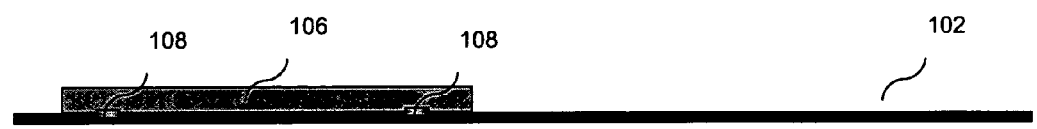
Figure 1B – First Chip Attachment
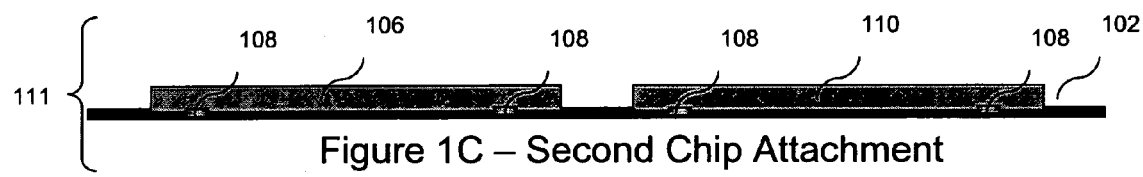
Figure 1C – Second Chip Attachment
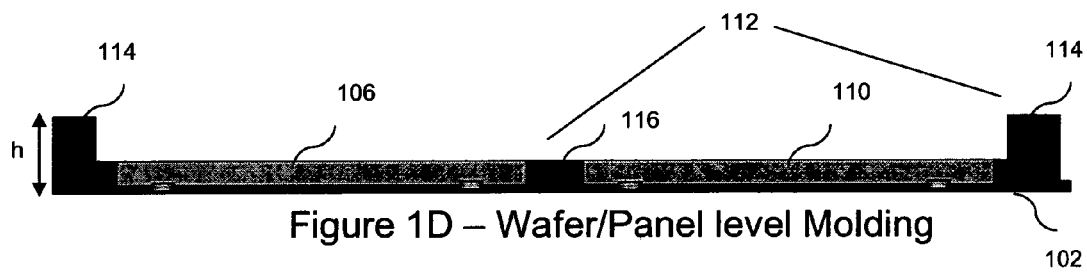
Figure 1D – Wafer/Panel level Molding
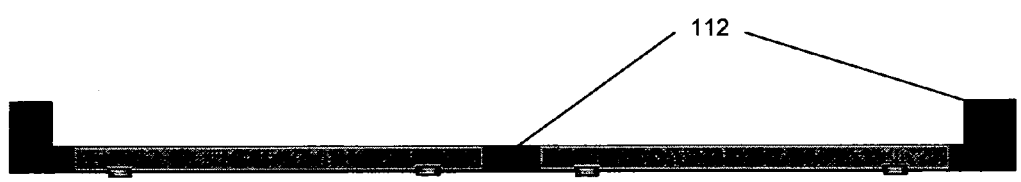
Figure 1E – Tape Removal

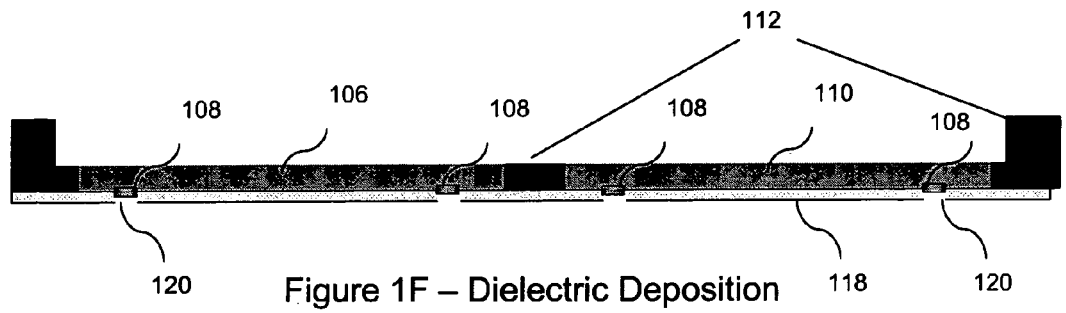
Figure 1F – Dielectric Deposition
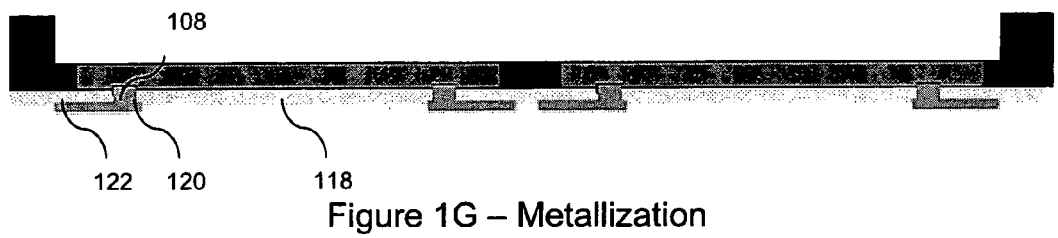
Figure 1G – Metallization
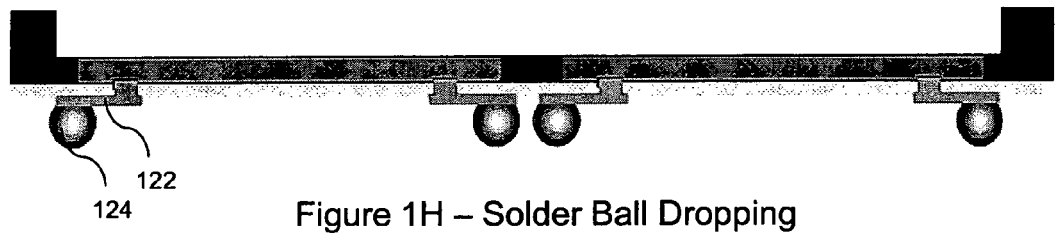
Figure 1H – Solder Ball Dropping
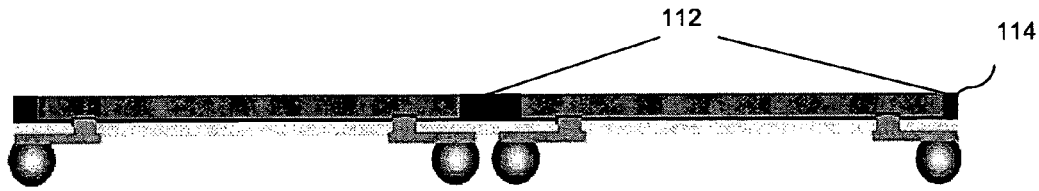
Figure 1I – Edge Ring Cutting
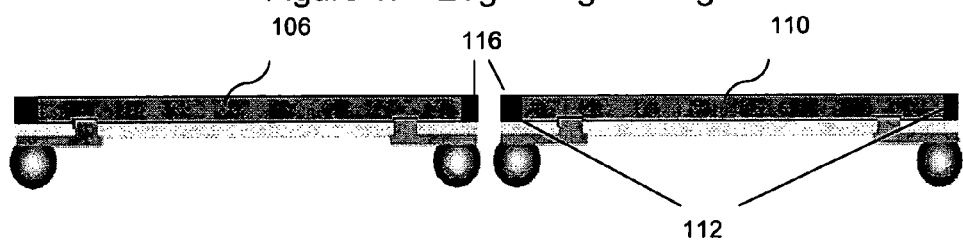
Figure 1J – Package Singulation Molding with stiffening rim Molding with stiffening structures Molding with stiffening structure on the saw street

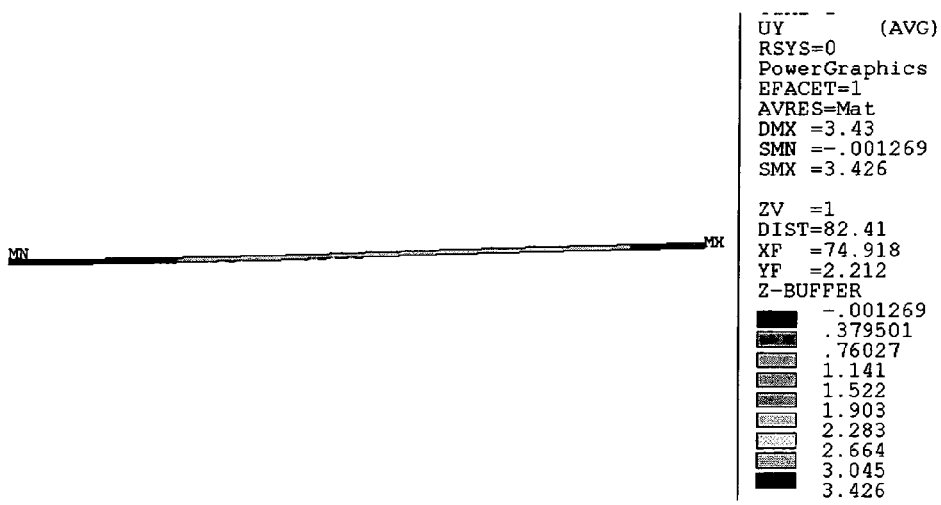
Figure 3A    Case 1 (Conventional Molding)
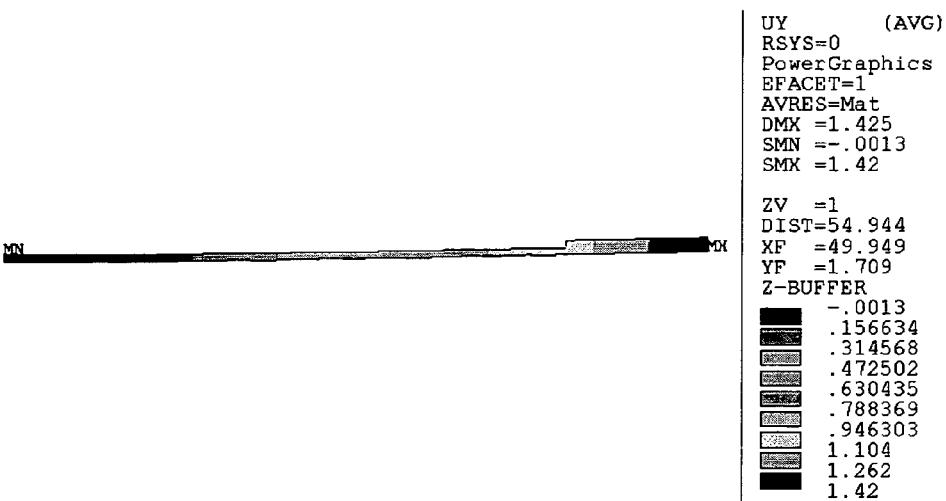
Figure 3B    Case 2 (With stiffening rim)

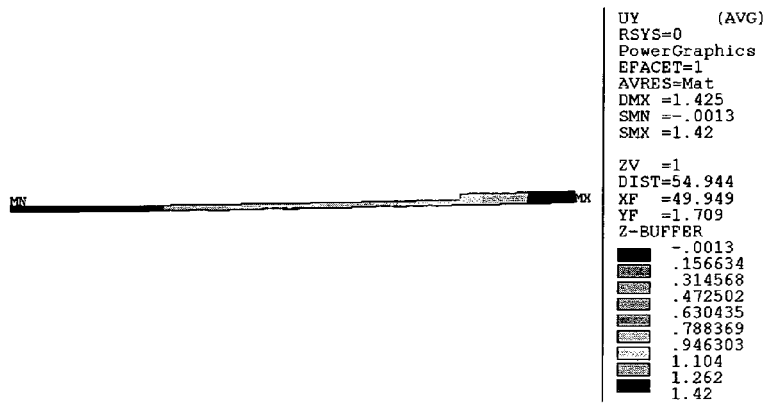
Figure 5A    Warpage = 1.42mm for rim width = 20mm
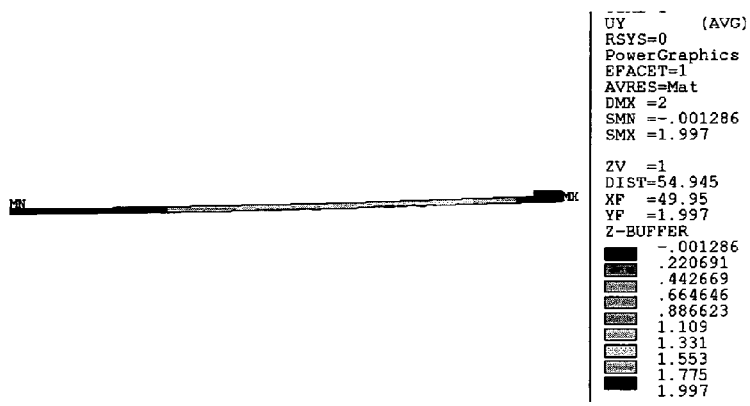
Figure 5B    Warpage = 1.997mm for rim width = 5mm

Figure 6A
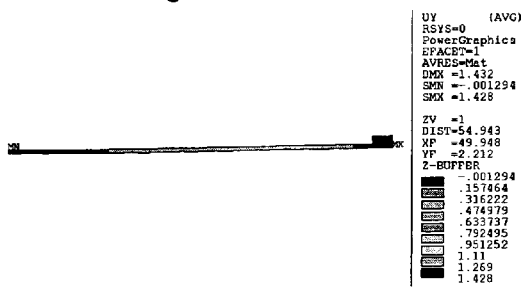
Warpage = 1.428 mm for molding
rim thickness = 2mm, width 5mm
Figure 6B
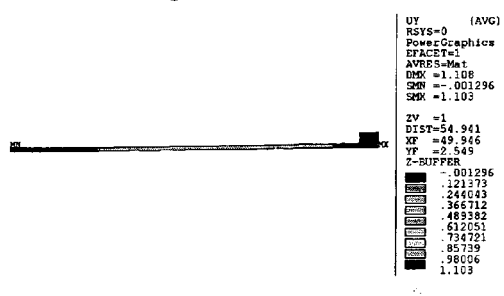
Warpage = 1.103 mm for molding
rim thickness = 3mm, width 5mm
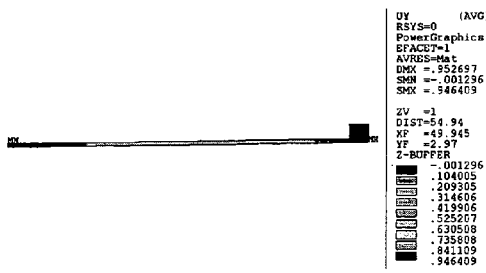
Warpage = 0.9464mm for molding
rim thickness = 4mm, width 5mm
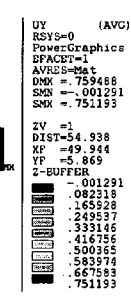
Warpage = 0.7512 mm for molding
rim thickness = 10mm, width 5mm
Figure 6C
Figure 6D

DESIGN A

DESIGN B

SEMICONDUCTOR STRUCTURE AND A METHOD OF MANUFACTURING A SEMICONDUCTOR STRUCTURE

CROSS REFERENCE TO RELATED APPLICATION

This application is a national stage application filed under 35 U.S.C. 371 of International Application No. PCT/SG2008/000194, filed May 30, 2008.

FIELD OF INVENTION

The present invention relates generally to a semiconductor structure and a method of manufacturing a semiconductor structure.

BACKGROUND OF INVENTION

A primary trend in electronics industry is product miniaturization. Product miniaturization involves ways to make products lighter, smaller, and less expensive yet more powerful, reliable, user-friendly, and functional. Some examples of products which have been miniaturized includes cellular phones, personal and sub-notebook computers, pagers, Personal Computer Memory Card International Association (PCMCIA) cards, camcorders, palmtop organizers, telecommunications equipment, and automotive components.

One of the factors that may limit product miniaturization involve packaging of the product. With integration of increased functionality in silicon chips as per Moore's Law, it is also desirable to shrink the package. One way to shrink the package involves a 2-dimensional (2D) level packaging. Some examples of 2D level packaging involves chips first or embedded chip packaging and embedded wafer level packaging.

Chips first or embedded chip packaging is a way to overcome these recent packaging integration challenges. One example of chips first or embedded chip packaging involves replacement of the lead frame based peripheral array packages with the plastic ball grid array (PBGA), in which the die is electrically connected to printed circuit board (PCB) substrate by wire bonding or flip chip technology. The chip is further covered with molding compound to avoid chip damage.

Another example of chips first or embedded chip packaging involves a method of embedding singulated die based on PCB technology. The singulated die is first attached onto the copper (Cu) base plate in the cavity of a PCB substrate and subsequent Cu rewiring and vias are then built-up on top of the active side based on the PCB technology. Finally, solder balls are formed on top of the Cu pads for electrical interconnection.

Embedded wafer level packaging takes chips first or embedded chip packaging to the next step, eliminating the PCB substrate, as well as the need to use wire bonding or flip-chip bumps to establish electrical connection. By removing the PCB substrate, packaging cost is reduced and its electrical performance is improved.

An example of embedded wafer level packaging involves a fabrication method based on wafer level processing. The fabrication method involves attaching singulated dies with active top side down onto a thermo-sensitive adhesive material coupled to a carrier plate. A wafer molding process is then used to encapsulate the attached dies on the carrier plate. The carrier plate is then separated and the dies are now housed onto mold compound forming a reconstituted wafer. Redistribution layer can be formed on the reconstituted wafer using conventional lithographic process. Solder bumps can also be formed on the wafer level prior to singulation.

However, one of the major challenges in embedded wafer level packaging is the warpage of the wafers. Therefore, there is a need for an improved solution to fabricate an embedded wafer level package semiconductor structure with low warpage.

SUMMARY OF INVENTION

According to one embodiment of the present invention, a semiconductor structure is provided. The semiconductor structure includes a first support structure, a plurality of chips formed on the first support structure and a reinforcing structure formed on the first support structure, the reinforcing structure including an outer surrounding element which at least partially surrounds the plurality of chips and extends from a surface of the first support structure to a height higher than each of the plurality of chips.

According to one embodiment of the present invention, a method of manufacturing a semiconductor structure is provided. The method includes forming a plurality of chips on a first support structure, forming a reinforcing structure on the first support structure wherein the reinforcing structure is formed such that the reinforcing structure includes an outer surrounding element which at least partially surrounds the plurality of chips and extends from a surface of the first support structure to a height higher than each of the plurality of chips.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1A to 1J show schematic cross-sectional views of manufacturing stages of a method of manufacturing a semiconductor structure according to one embodiment of the present invention;

FIGS. 3A and 3B show thermo-mechanical analysis results and reconstructed wafer warpage results of a conventional semiconductor structure and a semiconductor structure with a reinforcing structure according to one embodiment of the present invention;

FIGS. 5A and 5B show thermo-mechanical analysis results and reconstructed wafer warpage results of a semiconductor structure with variations in rim width according to one embodiment of the present invention;

FIG. 6A to 6D shows thermo-mechanical results and reconstructed wafer warpage results of a semiconductor structure with variations in rim thickness according to one embodiment of the present invention;

DESCRIPTION

Figure 2A:
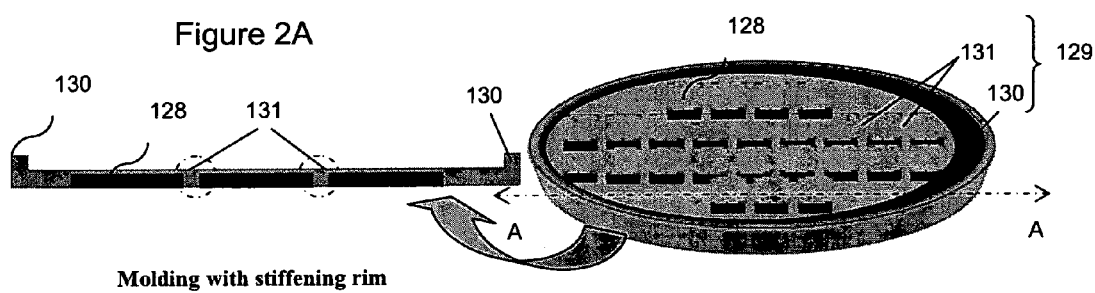
FIG. 2A to 2C show perspective side and top views of a semiconductor structure which corresponds to a stage as shown in FIG. 1E with variations in the reinforcing structure according to one embodiment of the present invention.

FIG. 1A to 1J show schematic cross-sectional views of manufacturing stages of a method of manufacturing a semiconductor structure according to one embodiment of the present invention. In FIG. 1A, a first support structure 102 is provided. The first support structure 102 serves as a support for subsequent deposition or attachment of a chip. The first support structure 102 may include adhesive layer. In one embodiment, there is a second support structure (not shown) positioned below the first support structure. The second support structure provides further support to the first support structure 102 and may include an edge support structure, a semiconductor wafer or a glass.

In FIG. 1B, a first chip 106 is attached onto a surface of the first support structure 102. The first chip 106 includes two chip pads 108 positioned on a lower surface of the first chip 106 and is attached with the two chip pads 108 in contact with the first support structure 102.

In FIG. 1C, a second chip 110 is attached onto the same surface of the first support structure 102 as the first chip 106. The second chip 110 is positioned adjacent to the first chip 106 and may be separated by a distance. The second chip 110 also includes two chip pads 108 and is attached with the two chip pads 108 in contact with the first support structure 102. The first 106 and second 110 chips may include only one chip pad 108 or may include more than two chip pads 108. In one embodiment, more than two chips are attached onto the first support structure 102. In another embodiment, the first chip 106 and the second chip 110 include good dies previously identified on a separate semiconductor wafer. The first chip 106 and the second chip 110 may also be an integrated circuit. The combination of the first support structure 102, the first chip 106 and the second chip 110 may be termed a reconstructed wafer structure 111 as shown in FIG. 1C.

In FIG. 1D, a reinforcing structure 112 is formed around and between the first 106 and second 110 chips. The reinforcing structure 112 includes a raised edge element 114 (or outer surrounding element) formed along an outer edge of the first support structure 102 and also in contact with respective portions of the first 106 and second 110 chips. The raised edge element 114 surrounds the first 106 and second 110 chip and extends from a surface of the first support structure 102 to a height denoted by "h" higher than the first chip 106 or the second chip 110. The reinforcing structure 112 also includes an intermediate straight line element 116 formed between the first 106 and second 110 chips. The intermediate straight line element 116 is formed such that it is of a substantially similar height as the first 106 and second 110 chips. In one embodiment, the intermediate straight line element 116 is raised and extends from a surface of the first support structure 102 to a height higher than the first chip 106 or the second chip 110, comparable to the height of the raised edge element 114. In another embodiment, the reinforcing structure 112 is substantially formed over an upper surface of each of the two chips 106, 110. The reinforcing structure 112 may be formed of a molding material. In yet another embodiment, the raised edge element 114 includes a ring-shaped element. To arrive at the reinforcing structure 112 as shown in FIG. 1D, a mold chase is designed with at least one groove to form the mold shape as in FIG. 1D. A suitable mold material is applied on the reconstructed wafer structure 111 as shown in FIG. 1C, then suitable heat and pressure are respectively applied along the mold chase. The mold material flows into the at least one groove and forms the desired shape of the reinforcing structure 112 as shown in FIG. 1D.

In FIG. 1E, the first support structure 102 is removed after the reinforcing structure 112 is formed. The first support structure 102 may be peeled off, by heat release, chemical release or UV release for example.

In FIG. 1F a layer of dielectric material 118 is deposited on the surface exposed by the removal of the first support structure 102. The layer of dielectric material 118 is formed on the exposed lower surfaces of the first chip 106, the second chip 110 and portions of the reinforcing structure 112. The layer of dielectric material 118 is also in contact with the chip pads 108. Next, a plurality of openings 120 are formed in the layer of dielectric material 118 by standard lithography and etching process to expose the chip pads 108.

Further in FIG. 1G, a layer of conductive material 122 is deposited in each opening 120 corresponding to each chip pad 108, a portion of the layer of conductive material 122 in contact with the chip pad 108. A portion of the layer of conductive material 122 is also deposited on an exposed surface of the layer of dielectric material 118. The layer of conductive material 122 may include metals for example copper, aluminium, titanium, aluminium, titanium, tandalum, gold. In one embodiment, multiple layers of dielectric materials 118 and conductive layers 122 may be formed on the surface exposed by the removal of the first support structure 102.

Next in FIG. 1H, a plurality of solder balls 124 are deposited on the respective portions of the respective layers of conductive material 122, each solder ball 124 in contact with a portion of each layer of conductive material 122.

In FIG. 1I, a portion of the raised edge element 114 of the reinforcing structure 112 formed on the outer edges of the first support structure 102 is removed. In one embodiment, the remaining portions of the raised edge element 114 is completely removed.

Finally in FIG. 1J, a portion of the intermediate straight line element 116 of the reinforcing structure 112 positioned between the first chip 106 and the second chip 110 is cut to separate the first chip 106 and the second chip 110. In one embodiment, there may be more than two chips in the reconstructed wafer structure 111, therefore any suitable singulation process like mechanical dicing, laser dicing may be used for the separation of the reconstructed wafer structure 111 into individual die. In one embodiment, the remaining portions of the intermediate straight line element 116 is completely removed.

Figure 2B:
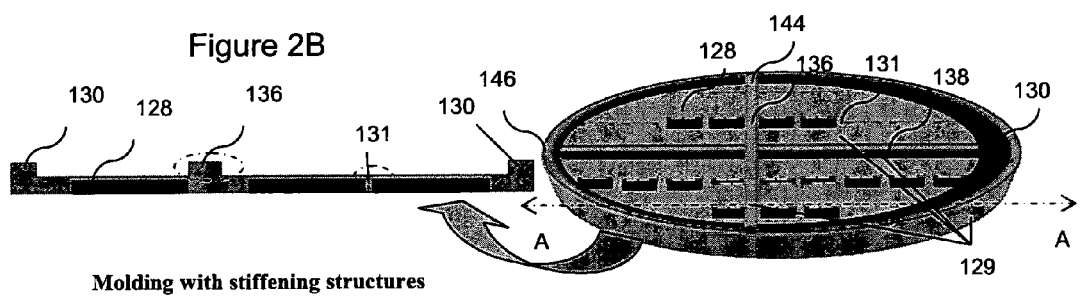
Figure 2C:
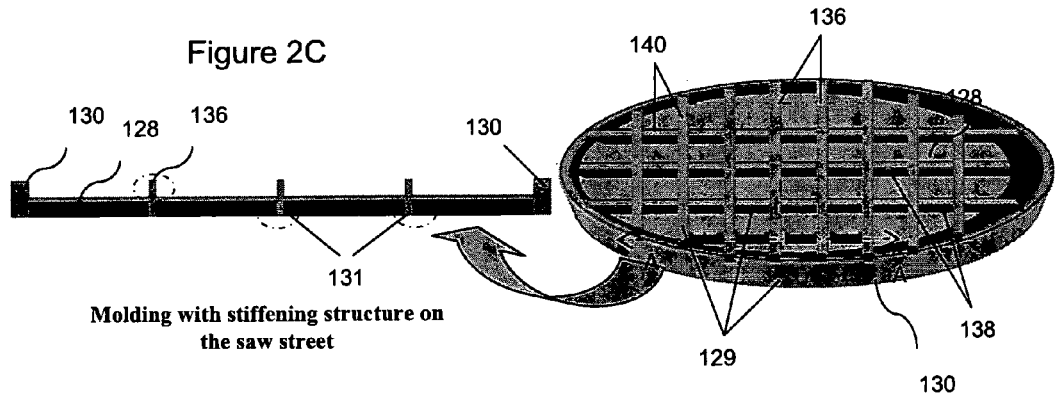

FIG. 2A to 2C show perspective side (across cross-sectional A-A) and top views of a semiconductor structure which corresponds to a stage as shown in FIG. 1E with variations in the reinforcing structure according to one embodiment of the present invention. FIG. 2A shows a semiconductor structure which corresponds to a stage as shown in FIG. 1E including a plurality of chips 128 and a reinforcing structure 129 formed around, between and over the plurality of chips 128. The reinforcing structure 129 includes a raised ring-shaped edge element 130 surrounding the plurality of chips 128 and a plurality of intermediate straight line elements 131 formed between two of the plurality of chips 128. Further, some portions of the reinforcing structure 129 are formed over one of the respective surfaces of the plurality of chips 128.

Like in FIG. 2A, FIG. 2B shows a semiconductor structure which corresponds to a stage as shown in FIG. 1E including a plurality of chips 128 and a reinforcing structure 129 formed around, between and over the plurality of chips 128. The reinforcing structure 129 includes a raised ring-shaped edge element 130 surrounding the plurality of chips 128 and a plurality of intermediate straight line elements 131 formed between two of the plurality of chips 128. Further, some portions of the reinforcing structure 129 are formed over the plurality of chips 128. In addition to FIG. 2A, the reinforcing structure 129 in FIG. 2B further includes a raised vertical straight line element 136 (or first raised straight line element) extending from a first edge 144 (or part) of the raised ring-shaped edge element 130 to an edge opposite to the first edge 144 of the raised ring-shaped edge element 130, the raised vertical straight line 136 formed between at least two of the plurality of chips 128. The reinforcing structure 129 may also include a raised horizontal straight line element 138 (or second raised straight line element) extending from a second edge 146 (or part) of the raised ring-shaped edge element 130 to an edge opposite to the second edge 146 of the raised ring-shaped edge element 130, the raised vertical straight line element 136 intersecting the raised horizontal straight line element 138 at one point. The raised vertical straight line element 136 is arranged substantially perpendicular to the raised horizontal straight line element 138. In another embodiment, there are more than two raised horizontal straight line elements 138 and/or raised vertical straight line elements 136, depending on requirements. Each raised vertical straight line element 136 may be arranged substantially parallel to another raised vertical straight line element 136 and each raised horizontal straight line element 138 may also be arranged substantially parallel to another raised horizontal straight line element 138. Each of the raised vertical straight line element 136 may be positioned on top of each of the intermediate straight line element 131 and each of the raised horizontal straight line element 138 may also be positioned on top of each of the intermediate straight line element 131. In one embodiment, the raised vertical straight line element 136 and the corresponding intermediate straight line element 131 may be an integrated element. Similarly, in another embodiment, the raised horizontal straight line element 138 and the corresponding intermediate straight line element 131 may be an integrated element.

Similar to FIG. 2B, FIG. 2C shows the reinforcing structure 129 which corresponds to a stage as shown in FIG. 1E including a raised ring-shaped edge element 130, a plurality of intermediate straight line elements 131 and a plurality of raised vertical 136 and horizontal 138 straight line elements. The intermediate straight line elements 131 are arranged on the respective saw streets 140, each saw street 140 is positioned between two chips 128. Further, each of the plurality of raised vertical 136 and horizontal 138 straight line elements are positioned on top of each of the straight line elements 131. In one embodiment, the raised vertical straight line element 136 and the corresponding intermediate straight line element 131 may be an integrated element. Similarly, in another embodiment, the raised horizontal straight line element 138 and the corresponding intermediate straight line element 131 may be an integrated element. Each of the plurality of raised vertical straight line elements 136 are arranged substantially parallel to each other and each of the plurality of the raised horizontal straight line elements 138 are also arranged substantially parallel to each other. The plurality of raised vertical straight line elements 136 are arranged substantially perpendicular to the plurality of raised horizontal straight line elements 138, thereby resulting in multiple intersection points.

In an embodiment, a reinforcing structure which corresponds to a stage as shown in FIG. 1E includes a raised ring-shaped edge element, a plurality of intermediate straight line elements and a plurality of raised straight line elements extending for a short distance from an edge of the raised ring-shaped element towards a centre of the raised ring-shaped edge element. The plurality of raised straight line elements may be evenly spaced apart along the edge of the raised ring-shaped edge element.

FIGS. 3A and 3B show thermo-mechanical analysis results and reconstructed wafer warpage results of a conventional semiconductor structure and a semiconductor structure with a reinforcing structure according to one embodiment of the present invention. Thermo-mechanical analysis is used to compare the reconstructed wafer warpage due to cooling of the wafer to room temperature after molding. Commercial grade mold compound material having properties of coefficient of thermal expansion (CTE)=8 ppm/deg, CTE=30 GPa have been used for the analysis. The size of the second support structure (reconstructed wafer) is about 8" and the thickness of the raised ring-shaped edge element is about 1 mm.

FIG. 3A shows a reconstructed wafer warpage of the conventional semiconductor structure, which is about 3.426 mm. As the reconstructed wafer warpage is relatively large, it may be difficult to hold on the wafer processing tools like track, lithography, physical vapor deposition (PVD), chemical vapor deposition (CVD) or on other wafer processing tool to form a redistribution layer (RDL).

FIG. 3B shows a reconstructed wafer warpage of the semiconductor structure with the reinforcing structure according to one embodiment of the present invention. The reconstructed wafer warpage of the semiconductor structure with the reinforcing structure which includes a raised ring-shaped edge element or edge stiffening rim is found to be about 1.42 mm. The reconstructed wafer warpage of the semiconductor structure with the reinforcing structure is about 59% less than the reconstructed wafer warpage of the conventional semiconductor structure. The reconstructed wafer warpage can be further reduced by adding more raised straight line elements or stiffening bars on the second support structure or wafer surface.

Figure 4:
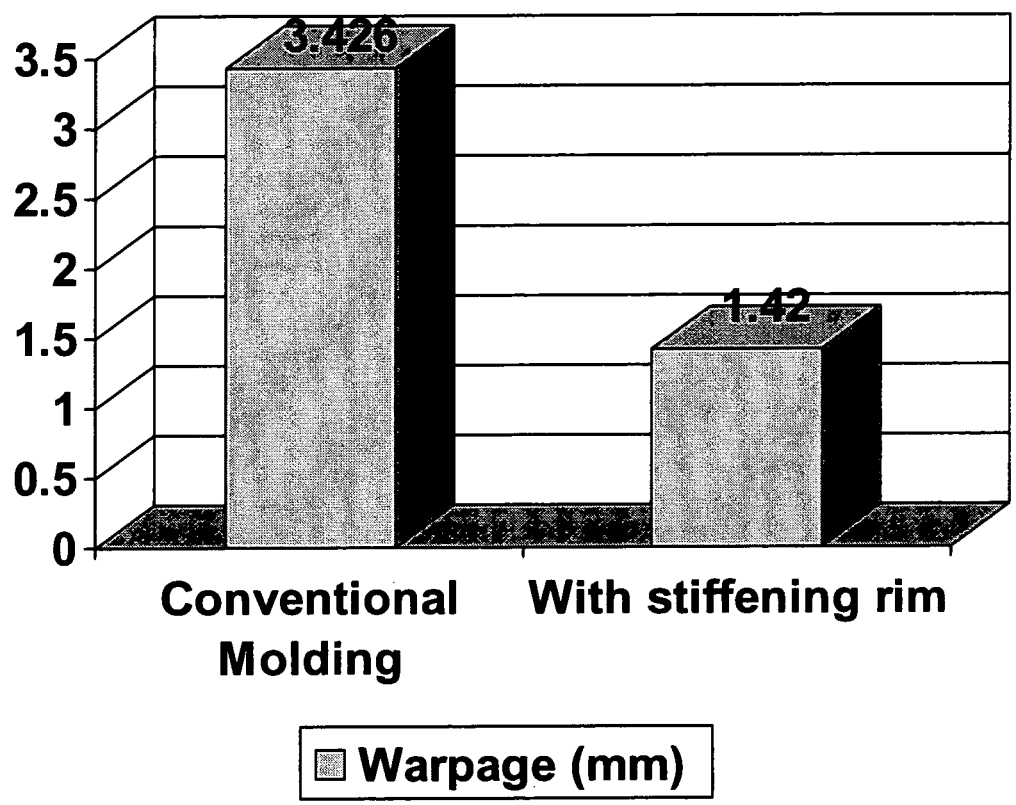
FIG. 4 shows a plot of reconstructed wafer warpage results of a conventional semiconductor structure and a semiconductor structure with a reinforcing structure according to one embodiment of the present invention.

FIG. 4 shows a plot of reconstructed wafer warpage results of a conventional semiconductor structure and a semiconductor structure with a reinforcing structure according to one embodiment of the present invention. In line with that as mentioned earlier in FIG. 3A and FIG. 3B, it is seen in FIG. 4 that the reconstructed wafer warpage of the conventional semiconductor structure is about 3.426 mm and the reconstructed wafer warpage of the semiconductor structure with the reinforcing structure is about 1.42 mm. The reconstructed wafer warpage of the semiconductor structure with the reinforcing structure is about 59% lesser than the reconstructed wafer warpage of the conventional semiconductor structure.

FIG. 5A and FIG. 5B show thermo-mechanical analysis results and reconstructed warpage results of a semiconductor structure with variation in rim width according to one embodiment of the present invention. In FIG. 5A and FIG. 5B, the semiconductor structure includes a reinforcing structure with a raised ring-shaped edge element or rim element. In FIG. 5A, the reconstructed wafer warpage is about 1.42 mm for a rim width of about 20 mm. In FIG. 5B, the reconstructed wafer warpage is about 1.997 for a rim width of about 5 mm.

From the results in FIG. 5A and FIG. 5B, it can be seen that the reconstructed wafer warpage decreases with an increase in rim width.

FIG. 6A to 6D shows thermo-mechanical results and reconstructed warpage results of a semiconductor structure with variations in rim thickness according to one embodiment of the present invention. Like in FIG. 5A and FIG. 5B, the semiconductor structure in FIG. 6A to 6D includes a reinforcing structure with a raised ring-shaped edge element or rim element. The rim width is the same in FIG. 6A to FIG. 6D and is about 5 mm. In FIG. 6A, the reconstructed wafer warpage is about 1.428 mm for a rim thickness of about 2 mm. In FIG. 6B, the reconstructed wafer warpage is about 1.103 mm for a rim thickness of about 3 mm. In FIG. 6C, the reconstructed wafer warpage is about 0.9464 mm for a rim thickness of about 4 mm. In FIG. 6D, the reconstructed wafer warpage is about 0.7512 mm for a rim thickness of about 10 mm. From the results in FIG. 6A to FIG. 6D, it can be seen that the reconstructed wafer warpage decrease with an increase in rim thickness.

Figure 7:
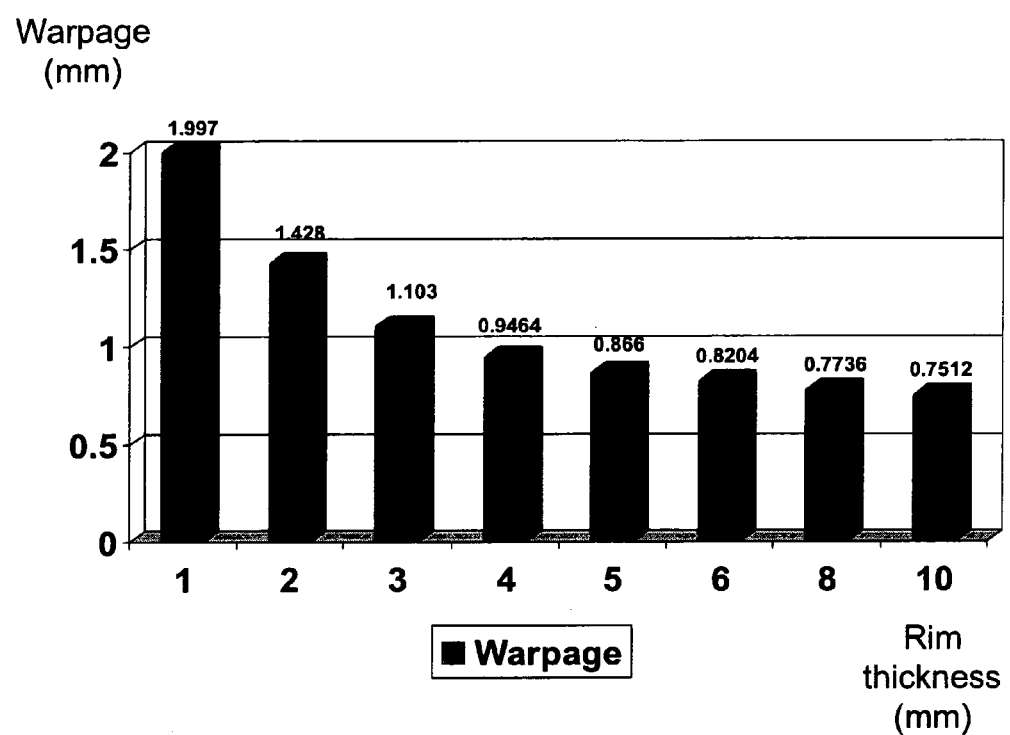
FIG. 7 shows a plot of warpage results versus rim thickness according to one embodiment of the present invention.

FIG. 7 shows a plot of reconstructed wafer warpage results versus rim thickness according to one embodiment of the present invention. Like in FIG. 6A to FIG. 6B, the semiconductor structure in FIG. 7 includes a reinforcing structure with a raised ring-shaped edge element or rim element. The reconstructed wafer warpage decreases from about 1.997 mm to about 0.7512 mm when the rim thickness increases from about 1 mm to about 10 mm. From FIG. 7, it can also be seen that the reconstructed wafer warpage reduction is small with rim thickness greater than about 5 mm.

Figure 8A:
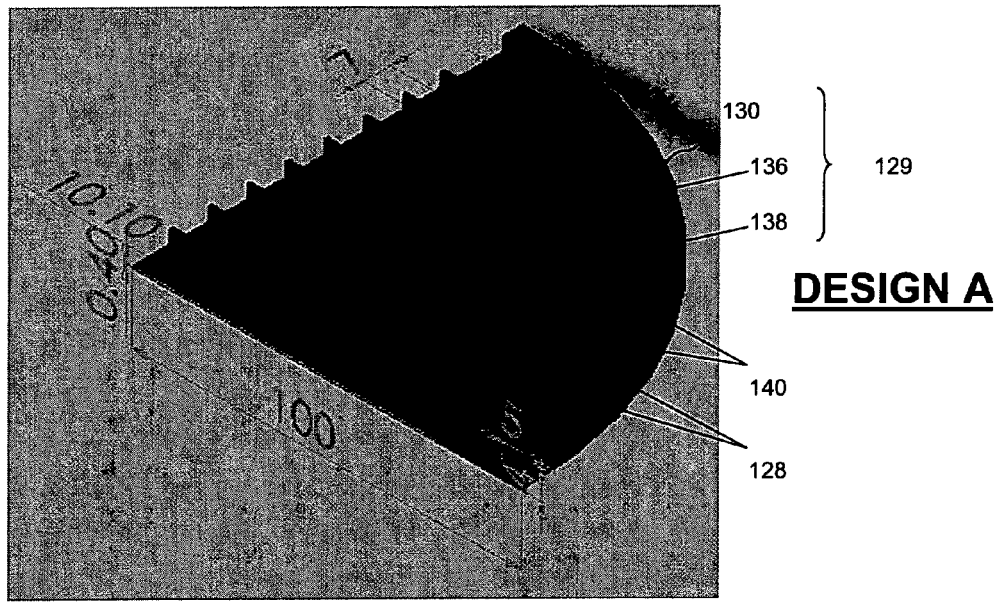
FIGS. 8A and 8B show perspective views of semiconductor structures with variations in the reinforcing structure according to one embodiment of the present invention.
Figure 8B:
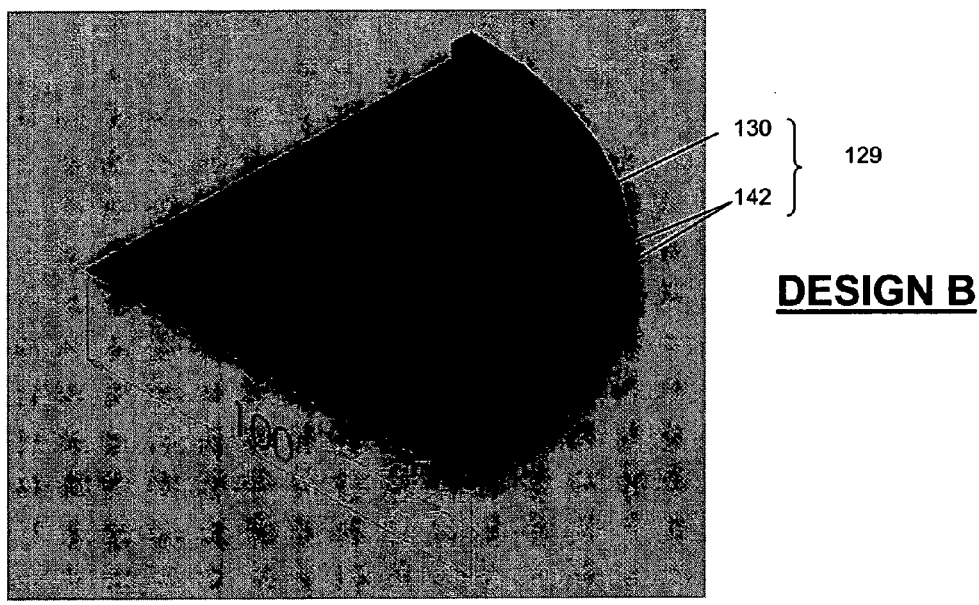

FIGS. 8A and 8B show a perspective view of a semiconductor structure with variations in the reinforcing structure according to one embodiment of the present invention. FIG. 8A which corresponds to FIG. 2C shows a semiconductor structure with a reinforcing structure 129 similar to the one in FIG. 2C. The reinforcing structure 129 includes a raised ring-shaped edge element 130 (rim element) and a plurality of raised vertical 136 and horizontal 138 straight line elements (stiffening rips). The plurality of raised vertical 136 and horizontal 138 straight line elements are arranged on the respective saw streets 140 on a first support structure 126, each saw street 140 is positioned between two chips 128. Each of the plurality of raised vertical straight line elements 136 are arranged substantially parallel to each other and each of the plurality of the raised horizontal straight line elements 138 are also arranged substantially parallel to each other. The plurality of raised vertical straight line elements 136 are arranged substantially perpendicular to the plurality of raised horizontal straight line elements 138, thereby resulting in multiple intersection points.

FIG. 8B shows a semiconductor structure with a reinforcing structure 129 which includes a raised ring-shaped edge element 130 and a plurality of raised straight line elements 142 extending for a short distance from the edge of the raised ring-shaped element 130 towards the centre of the raised ring-shaped edge element 130. The plurality of raised straight line elements 142 may be evenly spaced apart along the edge of the raised ring-shaped edge element 130.

Figure 9A:
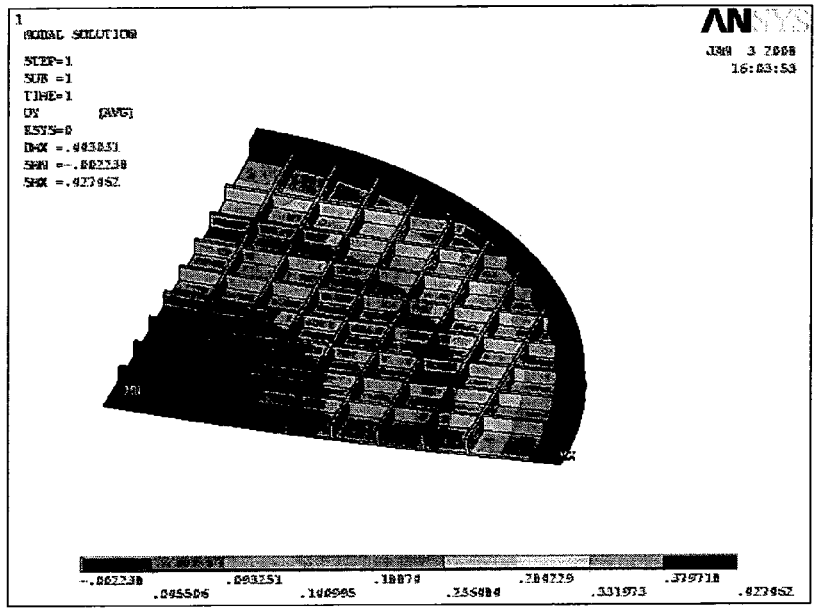
FIGS. 9A and 9B show simulation results of the semiconductor structures in FIGS. 8A and 8B according to one embodiment of the present invention.
Figure 9B:
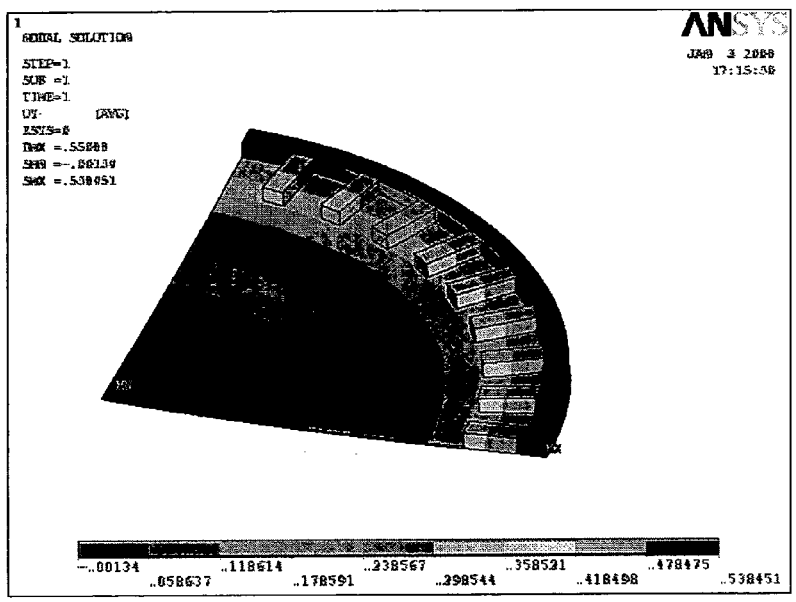

FIGS. 9A and 9B show simulation results of the semiconductor structures in FIGS. 8A and 8B according to one embodiment of the present invention. From the simulation results, it can be seen that the respective semiconductor structures in FIGS. 8A and 8B can reduce the wafer warpage drastically.

Figure 10:
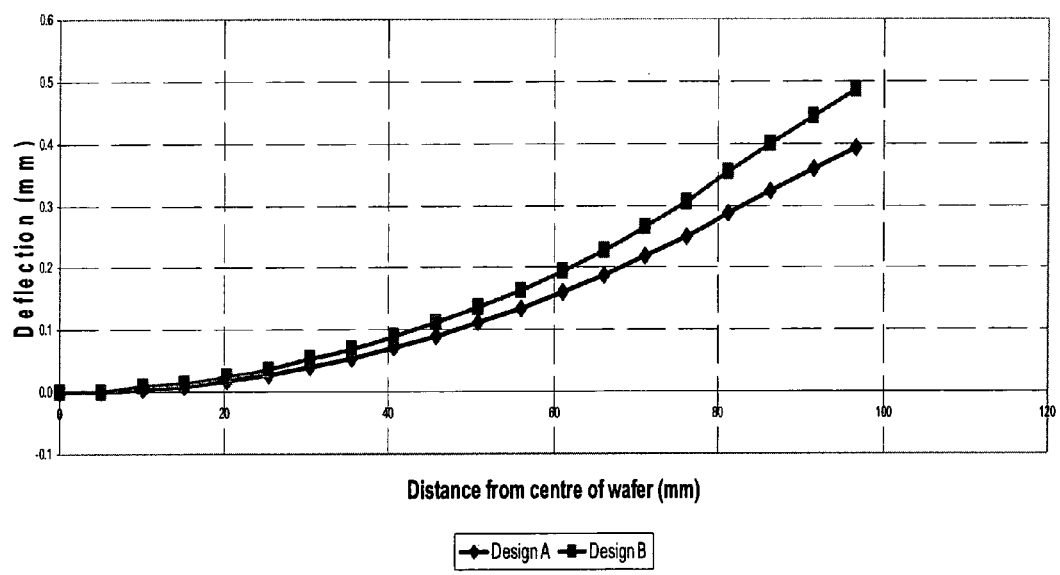
FIG. 10 show a plot of deflection versus distance from centre of a second support structure of the semiconductor structures in FIGS. 8A and 8B according to one embodiment of the present invention.

FIG. 10 show a plot of deflection versus distance from centre of a second support structure of the semiconductor structures in FIGS. 8A and 8B according to one embodiment of the present invention. It can be seen from FIG. 10 that the deflection increases as the distance from the centre of the second support structure (semiconductor wafer) is increased. It can also be seen that the deflection is slightly higher for the semiconductor structure with a reinforcing structure which includes only the raised ring-shaped edge element as compared to the semiconductor structure with a reinforcing structure which includes both the raised ring-shaped edge element and the plurality of horizontal and vertical straight line elements.

In the following description, further aspects of embodiments of the present invention will be explained.

According to one embodiment of the present invention, a solution to reduce reconstructed wafer warpage is provided.

According to one embodiment of the present invention, a semiconductor structure which has a semiconductor chip or a few semiconductor chips with copper post terminals and a rewiring layer is disclosed. The semiconductor structure may be embedded in polymer or plastic composition. Solder bumps are laid over the rewiring layer to make the electrical interconnections. The structure and method of embedding the die enables a wafer level reconstruction of the wafer and conventional wafer level processing can be carried over it. The redistributed layer enables the removal of wire bonds or flip chip interconnects and as well as electrically link the different semiconductor chips and components. The copper post with pre-designed heights enables the stacking of the chip in the embedded modules with the same available space.

According to one embodiment of the present invention, a novel method of embedding multiple semiconductor chips in wafer level with extremely low warpage is disclosed. The method enables miniaturization of electronics package in two dimensional (2D) as well as in three-dimensional (3D) by reducing the package thickness.

According to one embodiment of the present invention, the method also has advantages in terms of embedding simultaneously other actives, passives, and other package structures like heat spreader, Antenna, EMI shield for example.

According to one embodiment of the present invention, the reinforcing structure further includes at least one first raised straight line element extending from a first part of the outer surrounding element to a part opposite to the first part of the outer surrounding element, the at least one first raised straight line element further formed between at least two of the plurality of chips.

According to one embodiment of the present invention, the reinforcing structure further includes at least one second raised straight line element extending from a second part of the outer surrounding element to a part opposite to the second part of the outer surrounding element, the at least one second raised straight line element further formed between at least two of the plurality of chips.

According to one embodiment of the present invention, the at least one first raised straight line element is arranged perpendicular to the at least one second raised straight line element.

According to one embodiment of the present invention, the semiconductor structure further includes a second support structure, wherein the first support structure is formed on the second support structure.

According to one embodiment of the present invention, the first support structure includes an adhesive layer.

According to one embodiment of the present invention, the second support structure includes an edge support structure, a semiconductor wafer or glass.

According to one embodiment of the present invention, each of the plurality of chips includes an integrated circuit.

According to one embodiment of the present invention, each of the plurality of chips includes at least one chip pad.

According to one embodiment of the present invention, each of the plurality of chips is positioned with the at least one chip pad in contact with the first support structure.

According to one embodiment of the present invention, the reinforcing structure includes a molding material.

According to one embodiment of the present invention, the raised edge element comprises a ring-shaped element.

According to one embodiment of the present invention, the reinforcing structure further includes at least one intermediate straight line element formed between at least two of the plurality of chips.

According to one embodiment of the present invention, the reinforcing structure further includes at least one third straight raised line element partially extending from a third part of the outer surrounding element towards a centre of the outer surrounding element.

According to one embodiment of the present invention, a method of manufacturing a semiconductor structure includes forming the reinforcing structure such that the reinforcing structure further comprises at least one first raised straight line element extending from a first part of the outer surrounding element to a part opposite to the first part of the outer surrounding element, the at least one first raised straight line element further formed between at least two of the plurality of chips.

According to one embodiment of the present invention, a method of manufacturing a semiconductor structure includes forming the reinforcing structure such that the reinforcing structure further comprises at least one second raised straight line element extending from a second part of the outer surrounding element to a part opposite to the second part of the outer surrounding element, the at least one second raised straight line element further formed between at least two of the plurality of chips.

According to one embodiment of the present invention, a method of manufacturing a semiconductor structure includes forming the reinforcing structure such that the at least one first raised straight line element is arranged perpendicular to the at least one second raised straight line element.

According to one embodiment of the present invention, a method of manufacturing a semiconductor structure further includes forming the first support structure on a second support structure before forming the plurality of chips on the first support structure.

According to one embodiment of the present invention, each of the plurality of chips comprises at least one chip pad.

According to one embodiment of the present invention, a method of manufacturing a semiconductor structure further includes forming the plurality of chips with the at least one chip pad in contact with the first support structure.

According to one embodiment of the present invention, a method of manufacturing a semiconductor structure further includes removing the first support structure after forming the reinforcing structure.

According to one embodiment of the present invention, a method of manufacturing a semiconductor structure further includes forming a dielectric layer on an exposed surface of the plurality of chips after removing the first support structure, the dielectric layer being in contact with the at least one chip pad.

According to one embodiment of the present invention, a method of manufacturing a semiconductor structure further includes forming at least one opening in the dielectric layer until the at least one chip pad is exposed.

According to one embodiment of the present invention, a method of manufacturing a semiconductor structure further includes depositing a conductive material into the at least one opening formed in the dielectric layer, the conductive material being in contact with the at least one chip pad.

According to one embodiment of the present invention, a method of manufacturing a semiconductor structure further includes forming a solder material on the conductive material.

According to one embodiment of the present invention, a method of manufacturing a semiconductor structure further includes removing the reinforcing structure along the edge of the first support structure after having formed the solder material on the conductive material.

According to one embodiment of the present invention, a method of manufacturing a semiconductor structure further includes separating each of the plurality of chips after removing the reinforcing structure along the edge of the first support structure.

According to one embodiment of the present invention, the method of manufacturing a semiconductor structure further includes forming the reinforcing structure such that the reinforcing structure further comprises at least one intermediate straight line element formed between at least two of the plurality of chips.

According to one embodiment of the present invention, the method of manufacturing a semiconductor structure further includes forming the reinforcing structure such that the reinforcing structure further comprises at least one third raised straight line element partially extending from a third part of the outer surrounding element towards a centre of the outer surrounding element.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A semiconductor structure comprising:
   a first support structure;
   a plurality of chips formed on the first support structure; and
   a reinforcing structure formed on the first support structure, the reinforcing structure comprising an outer surrounding element;
   which at least partially surrounds the plurality of chips and extends from a surface of the first support structure to a height higher than each of the plurality of chips;
   wherein the reinforcing structure further comprises at least one intermediate straight line element formed between at least two of the plurality of chips; and
   wherein the outer surrounding element and the at least one intermediate straight line element respectively contact sidewalls of the plurality of chips.

2. The semiconductor structure according to claim 1, wherein the reinforcing structure further comprises at least one first raised straight line element extending from a first part of the outer surrounding element to a part opposite to the first part of the outer surrounding element, the at least one first raised straight line element further formed between at least two of the plurality of chips.

3. The semiconductor structure according to claim 2, wherein the reinforcing structure further comprises at least one second raised straight line element extending from a second part of the outer surrounding element to a part opposite to the second part of the outer surrounding element, the at least one second raised straight line element further formed between at least two of the plurality of chips.

4. The semiconductor structure according to claim 3, wherein the at least one first raised straight line element is arranged perpendicular to the at least one second raised straight line element.

5. The semiconductor structure according to claim 1, further comprising a second support structure, wherein the first support structure is formed on the second support structure.

6. The semiconductor structure according to claim 5, wherein the second support structure comprises an edge support structure, a semiconductor wafer or glass.

7. The semiconductor structure according to claim 1, wherein the first support structure comprises an adhesive layer.

8. The semiconductor structure according to claim 1, wherein each of the plurality of chips comprises an integrated circuit.

9. The semiconductor structure according to claim 1, wherein each of the plurality of chips comprises at least one chip pad.

10. The semiconductor structure according to claim 9, wherein each of the plurality of chips is positioned with the at least one chip pad in contact with the first support structure.

11. The semiconductor structure according to claim 1, wherein the reinforcing structure comprises a molding material.

12. The semiconductor structure according to claim 1, wherein the raised edge element comprises a ring-shaped element.

13. The semiconductor structure according to claim 1, wherein the reinforcing structure further comprises at least one third straight raised line element partially extending from a third part of the outer surrounding element towards a centre of the outer surrounding element.

\* \* \* \* \*

UNITED STATES PATENT AND TRADEMARK OFFICE
CERTIFICATE OF CORRECTION

PATENT NO. : 8,466,550 B2
APPLICATION NO. : 12/994431
DATED : June 18, 2013
INVENTOR(S) : Kalandar et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 257 days.

Signed and Sealed this
Eighth Day of September, 2015

Michelle K. Lee
*Director of the United States Patent and Trademark Office*